(12) United States Patent
Yamagami

(10) Patent No.: US 10,720,194 B2
(45) Date of Patent: Jul. 21, 2020

(54) SEMICONDUCTOR MEMORY DEVICE AND DATA WRITING METHOD

(71) Applicant: SOCIONEXT INC., Kanagawa (JP)

(72) Inventor: Yoshinobu Yamagami, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 16/452,365

(22) Filed: Jun. 25, 2019

(65) Prior Publication Data
US 2020/0005838 A1 Jan. 2, 2020

(51) Int. Cl.
G11C 11/34 (2006.01)
G11C 7/12 (2006.01)
G11C 8/08 (2006.01)
G11C 5/14 (2006.01)
G11C 7/10 (2006.01)
G11C 7/22 (2006.01)

(52) U.S. Cl.
CPC .............. G11C 7/12 (2013.01); G11C 5/145 (2013.01); G11C 7/109 (2013.01); G11C 7/1084 (2013.01); G11C 7/1087 (2013.01); G11C 7/1096 (2013.01); G11C 7/222 (2013.01); G11C 8/08 (2013.01)

(58) Field of Classification Search
CPC ....... G11C 7/12; G11C 7/1084; G11C 7/1087; G11C 7/109; G11C 7/1096; G11C 7/22
See application file for complete search history.

(56) References Cited

U.S. PATENT DOCUMENTS

| 7,486,540 | B2 | 2/2009 | Gouin et al. | |
| 9,378,788 | B2 | 6/2016 | Kolar et al. | |
| 2006/0262635 | A1 | 11/2006 | Kanehara | |
| 2009/0161449 | A1* | 6/2009 | Yamagami | G11C 11/419 365/189.16 |
| 2010/0188909 | A1* | 7/2010 | Kenkare | G11C 11/419 365/189.16 |
| 2011/0032779 | A1* | 2/2011 | Aihara | G11C 7/12 365/189.16 |
| 2011/0069574 | A1* | 3/2011 | Hirabayashi | G11C 11/413 365/226 |
| 2011/0305072 | A1 | 12/2011 | Ishii et al. | |
| 2015/0049540 | A1 | 2/2015 | Son et al. | |
| 2015/0131364 | A1 | 5/2015 | Hsieh et al. | |
| 2018/0374516 | A1* | 12/2018 | Ochiai | G11C 11/413 |

FOREIGN PATENT DOCUMENTS

| JP | 2006-323950 A | 11/2006 |
| JP | 2011-258270 A | 12/2011 |

* cited by examiner

Primary Examiner — Toan K Le
(74) Attorney, Agent, or Firm — McDermott Will & Emery LLP

(57) ABSTRACT

In a semiconductor memory device, a memory cell array includes a plurality of memory cells. A write circuit includes a negative potential generating circuit that generates a potential lower than a lower power supply potential applied to the memory cells. When a write mask signal indicates an enabled state, the write circuit activates the negative potential generating circuit, and supplies the potential generated by the negative potential generating circuit to a bit line to be supplied with low data. On the other hand, when the write mask signal indicates a disabled state, the write circuit supplies no data to bit line pairs, and inactivates the negative potential generating circuit.

5 Claims, 8 Drawing Sheets

SEMICONDUCTOR MEMORY DEVICE AND DATA WRITING METHOD

CROSS-REFERENCE TO RELATED APPLICATIONS

This application claims priority to International Application No. PCT/JP2018/024905 filed on Jun. 29, 2018, the entire disclosure of which is incorporated by reference herein.

BACKGROUND

The present disclosure relates to a semiconductor memory device, and a technique of setting the potential of a bit line to a negative potential in a write operation.

With respect to a semiconductor memory device, known techniques set the potential of a bit line to a negative potential in a write operation to improve a write margin. For example, U.S. Pat. No. 7,486,540 discloses a configuration including a capacitive element 605 comprised of a MOS transistor. In a write operation with write data DB and a write control signal WE, the capacitive element 605 performs a step-down operation in accordance with control by a signal BSTB to set the potential of a bit line to a negative potential (see FIGS. 6 and 7). On the other hand, U.S. Pat. No. 9,378,788 discloses a configuration including a capacitive element 216 comprised of a MOS transistor. In a write operation with write data DATA_IN and a write control signal WRITE_EN, the capacitive element 216 performs a step-down operation to set the potential of a bit line to a negative potential (FIG. 3).

SUMMARY

Some semiconductor memory devices support what is called a "bit write function." The "bit write function" refers to a function of controlling whether or not to write data in a memory cell connected to a certain bit I/O.

However, in each of U.S. Pat. Nos. 7,486,540 and 9,378,788, all bit I/Os generate negative potentials in the write operation. If the configuration of each of the U.S. patents, as it is, is intended to support the bit write function, step-down operations are also performed to generate negative potentials for the bit I/Os requiring no write operation. This leads to unnecessary power consumption.

The present disclosure provides a semiconductor memory device employing a technique of setting the potential of a bit line to a negative potential in a write operation. The semiconductor memory device aims to support a bit write function at lower power consumption.

A semiconductor memory device according to a first aspect of the present disclosure includes: a plurality of bit line pairs; a plurality of word lines; a memory cell array including a plurality of memory cells arranged in an array, each of the plurality of memory cells being provided between a first power supply with a first potential and a second power supply with a second potential lower than the first potential, and being connected to one of the bit line pairs and one of the word lines; and a write circuit provided for one or more of the bit line pairs, and supplying data to the one or more of the bit line pairs in accordance with a bit value corresponding to the one or more of the bit line pairs of input data having a plurality of bits in a write operation. The write circuit includes a negative potential generating circuit that generates a third potential lower than the second potential, and receives a write mask signal with a plurality of bits each corresponding to respective one of the bit line pairs, the write mask signal indicating an enabled state in which data is to be supplied to the one of the bit line pairs or a disabled state in which no data is to be supplied to the one of the bit line pairs. When the write mask signal indicates the enabled state, the write circuit supplies data to the one of the bit line pairs in accordance with a write clock and activates the negative potential generating circuit so as to supply the third potential generated by the negative potential generating circuit to one of bit lines included in the one of the bit line pairs, the one of the bit lines being supplied with low data. When the write mask signal indicates the disabled state, the write circuit supplies no data to the one of the bit line pairs and inactivates the negative potential generating circuit.

According to this aspect, the memory cell array includes the memory cells, each of which is provided between the first power supply with the first potential and the second power supply with the second potential lower than the first potential, and connected to the bit line pair and the word line. The write circuit includes the negative potential generating circuit that generates the third potential lower than the second potential, which is the lower power supply potential applied to the memory cells. When the write mask signal indicates the enabled state, the write circuit supplies the data to the one of the bit line pairs, and activates the negative potential generating circuit to supply the third potential generated by the negative potential generating circuit to one of bit lines included in the one of the bit line pairs, the one of the bit lines being supplied with low data. On the other hand, when the write mask signal indicates the disabled state, the write circuit supplies no data to the one of the bit line pairs, and inactivates the negative potential generating circuit. That is, in the write circuit, when no data is to be supplied to the one of the bit line pairs, the negative potential generating circuit becomes inactive, thereby avoiding unnecessary power consumption. Therefore, the semiconductor memory device supports the bit write function with lower power consumption.

A semiconductor memory device according to a second aspect of the present disclosure includes: a plurality of bit line pairs; a plurality of word lines; a memory cell array including a plurality of memory cells arranged in an array, each of the plurality of memory cells being provided between a first power supply with a first potential and a second power supply with a second potential lower than the first potential, and being connected to one of the bit line pairs and one of the word lines; and a negative potential generating circuit that generates a third potential lower than the second potential. In the semiconductor memory device, a method includes: when data is to be supplied to one or more of the bit line pairs, activating the negative potential generating circuit in accordance with a write clock so as to supply the third potential generated by the negative potential generating circuit to one of bit lines included in the one or more of the bit line pairs, the one of the bit lines being supplied with low data; and when no data is to be supplied to the one or more of the bit line pairs, inactivating the negative potential generating circuit.

According to this aspect, the semiconductor memory device includes the memory cells, each of which is provided between the first power supply with the first potential and the second power supply with the second potential lower than the first potential, and connected to the bit line pair and the word line. When data is to be supplied to the bit line pairs, the device activates the negative potential generating circuit, which generates the third potential lower than the second potential, so as to supply the third potential generated by the negative potential generating circuit to one of bit lines included in the one of the bit line pairs, the one of the bit lines being supplied with low data. The device inactivates the negative potential generating circuit, when supplying no data to the bit line pairs. That is, when no data is to be supplied to the bit line pairs, the negative potential generating circuit is inactivated, thereby avoiding unnecessary power consumption. Therefore, the semiconductor memory device supports the bit write function with lower power consumption.

The present disclosure provides a semiconductor memory device employing a technique of setting the potential of a bit line to a negative potential in a write operation, and capable of supporting a bit write function with lower power consumption.

DETAILED DESCRIPTION

Figure 1:
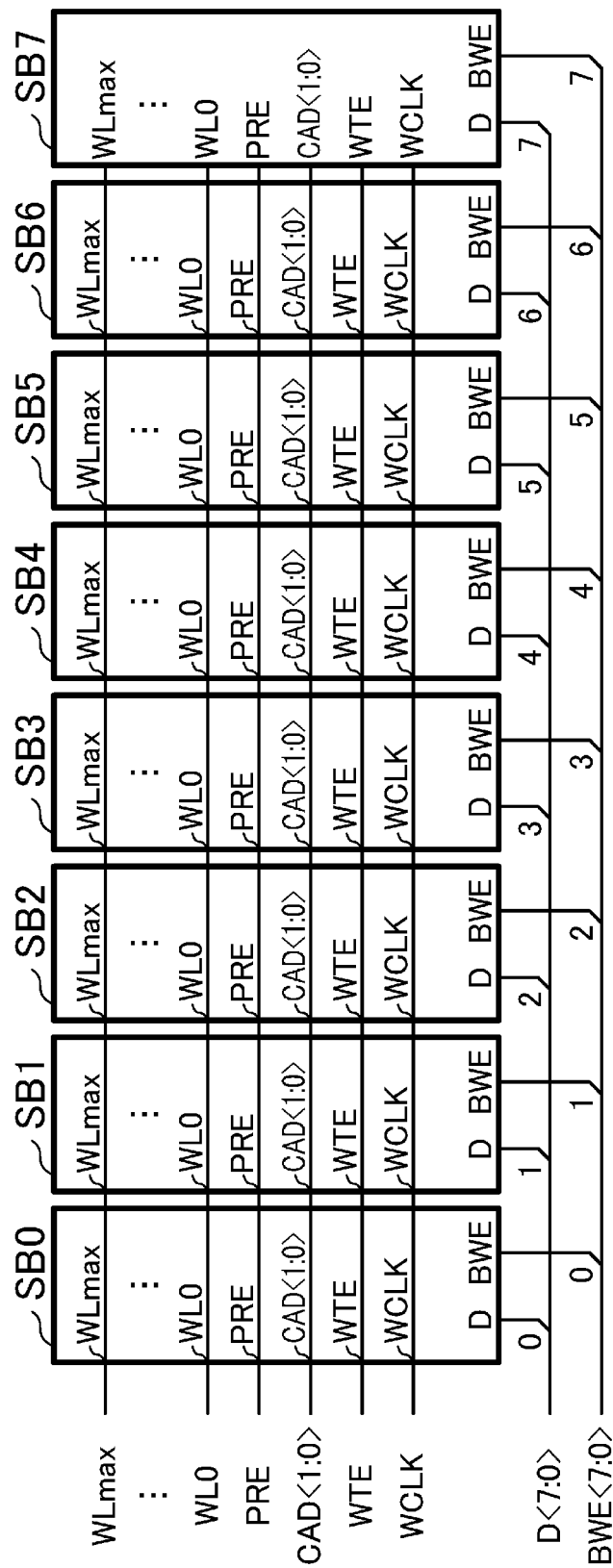
FIG. 1 illustrates an exemplary circuit configuration of a semiconductor memory device according to an embodiment.

Embodiments will be described in detail below with reference to the drawings. In the following description, reference characters denoting signal lines and nodes may be used to designate signals and data of the signal lines and potentials of the nodes. VDD and VSS represent both of power supplies themselves and potentials supplied by the respective power supplies. In addition, high levels of the signals may be denoted by "H," and low levels may be denoted by "L."

First Embodiment

FIG. 1 illustrates an exemplary configuration of a semiconductor memory device according to an embodiment. The semiconductor memory device according to this embodiment includes a plurality of sub-blocks. Each sub-block includes one or more bit line pairs. The configuration of FIG. 1 includes eight sub-blocks SB0 to SB7, each of which includes two pairs of bit lines. Input data D has a plurality of bits corresponding to the respective sub-blocks. In the configuration of FIG. 1, the input data D has 8 bits. A bit write signal BWE is a signal indicating whether or not to supply data to the bit line pairs, and functions as a write mask signal. The bit write signal BWE has a plurality of bits corresponding to the respective sub-blocks. In the configuration shown in FIG. 1, the bit write signal BWE has 8 bits. That is, the bit write signal BWE controls whether or not to supply the input data D to each of the sub-blocks in an independent manner. WL0 to WLmax represent word lines, PRE represents a precharge signal, CAD represents a column address signal, WTE represents a write control signal, and WCLK represents a write clock.

Figure 2:
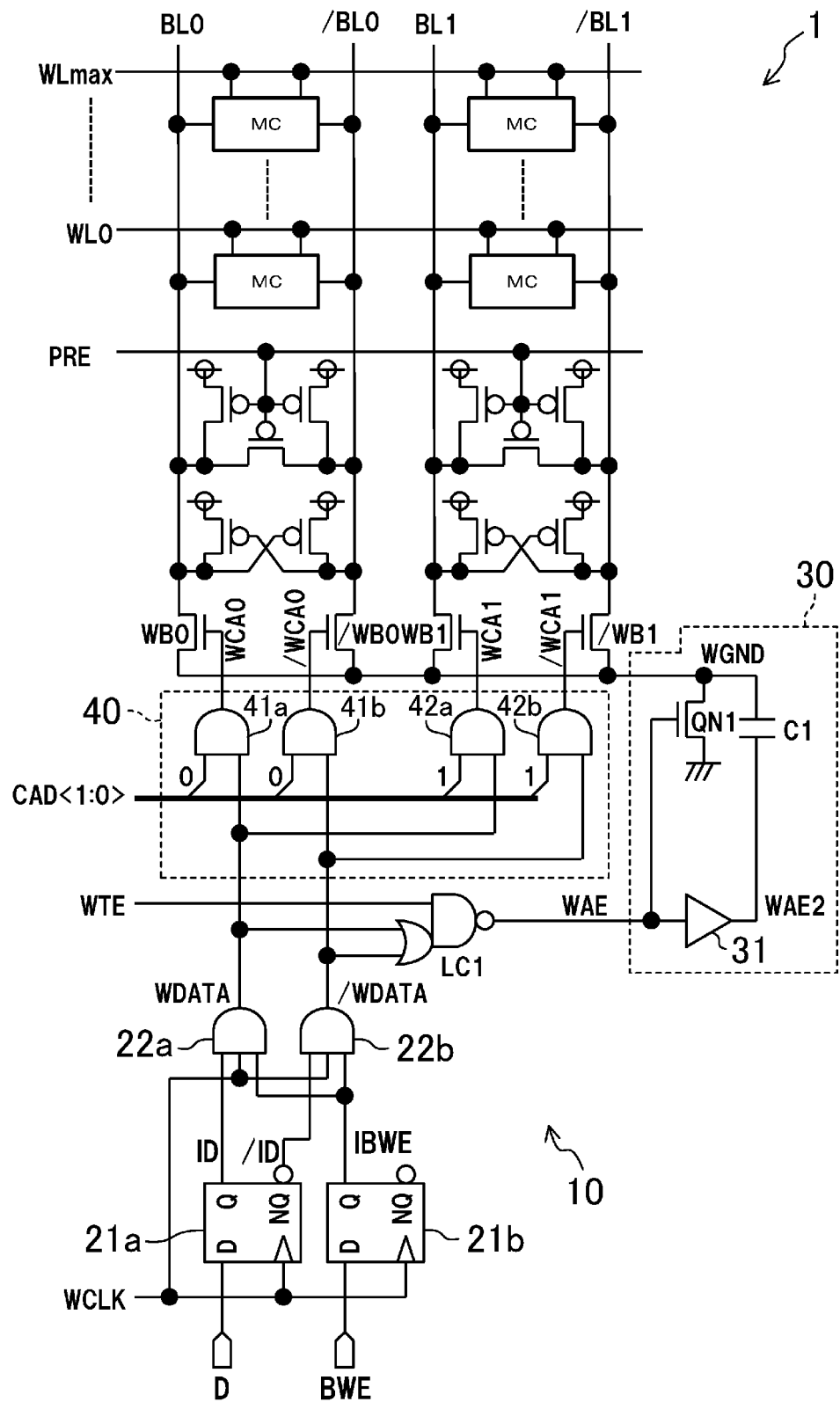
FIG. 2 illustrates an exemplary circuit configuration of a sub-block of a semiconductor memory device according to a first embodiment.

FIG. 2 illustrates an exemplary circuit configuration of a sub-block of a semiconductor memory device according to a first embodiment. In FIG. 2, (BL0, /BL0) and (BL1, /BL1) represent bit line pairs, and MC represents a memory cell. A plurality of memory cells MC are arranged in an array to form a memory cell array 1. Each memory cell MC is connected to one of the bit line pairs and one of the word lines.

Figure 3:
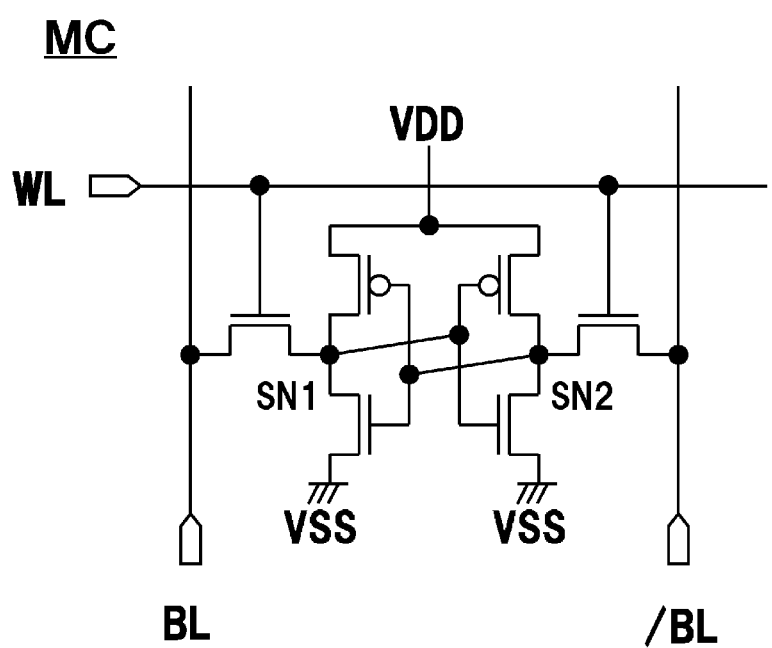
FIG. 3 illustrates a circuit configuration of a memory cell.

FIG. 3 illustrates a circuit configuration of the memory cell MC. The memory cell MC shown in FIG. 3 is what is called a 1RW memory cell, and includes six transistors. As illustrated in FIG. 3, the memory cell MC is provided between a power supply VDD, which supplies a power supply potential VDD as a first potential, and power supplies VSS, each of which supplies a ground potential VSS as a second potential.

For the sake of simplification, no read system circuit is shown in FIG. 2.

A write circuit 10 includes D latch circuits 21a and 21b, 3-input AND circuits 22a and 22b, a logic circuit LC1, and a negative potential generating circuit 30. The D latch circuit 21a receives the input data D as a data input, and the write clock WCLK as a clock input. The D latch circuit 21b receives the bit write signal BWE as a data input, and the write clock WCLK as a clock input. The 3-input AND circuit 22a receives an output ID of the D latch circuit 21a, the write clock WCLK, and an output IBWE of the D latch circuit 21b as inputs. The 3-input AND circuit 22b receives an inverted output /ID of the D latch circuit 21a, the write clock WCLK, and the output IBWE of the D latch circuit 21b as inputs. Outputs of the 3-input AND gates 22a and 22b are respectively connected to WDATA and /WDATA that form a write data line pair.

The logic circuit LC1 is comprised of a combination of an OR gate and a NAND gate. The OR gate receives write data WDATA and /WDATA as inputs, while the NAND gate receives an output of the OR gate and the write control signal WTE as inputs. An output WAE of the logic circuit LC1 is provided to the negative potential generating circuit 30.

The negative potential generating circuit 30 includes a transistor QN1, a capacitive element C1, and a buffer circuit 31. The circuit 30 controls the potential of an output node WGND in accordance with the output WAE of the logic circuit LC1. Specifically, when the output WAE is "H" (i.e., at a high level), the transistor QN1 is turned on and the output node WGND is set to the ground potential VSS. When the output WAE is "L" (i.e., at a low level), the transistor QN1 is turned off and an output WAE2 of the buffer circuit 31 is set to "L." Thus, the capacitive element C1 performs a step-down (charge pump) operation to set the output node WGND to a potential (a third potential) lower than the ground potential VSS. That is, the negative potential generating circuit 30 generates the third potential lower than the ground potential VSS. In practice, the capacitive element C1 is comprised of, for example, a MOS transistor whose source and drain are short-circuited. The level of the third potential is adjustable by an increase/decrease in the size of the MOS transistor.

A column selection circuit 40 includes four AND gates 41a, 41b, 42a, and 42b corresponding to the bit lines BL0, /BL0, BL1, and /BL1, respectively. The AND gates 41a and 41*b* receive a column address signal CAD<0> as one of inputs. The other inputs of the AND gates 41*a* and 41*b* are connected to WDATA and /WDATA of the write data line pair, respectively. The AND gates 42*a* and 42*b* receive a column address signal CAD<1> as one of inputs. The other inputs of the AND gates 42*a* and 42*b* are connected to WDATA and /WDATA of the write data line pair, respectively.

The bit lines BL0, /BL0, BL1, and /BL1 are provided with transistors WB0, /WB0, WB1, and /WB1, respectively. The source nodes of the transistors WB0, /WB0, WB1, and /WB1 are connected to the output node WGND of the negative potential generating circuit 30. The gates of the transistors WB0, /WB0, WB1, and /WB1 are supplied with the outputs of the AND gates 41*a*, 41*b*, 42*a*, and 42*b* of the column selection circuit 40, respectively.

Figure 4:
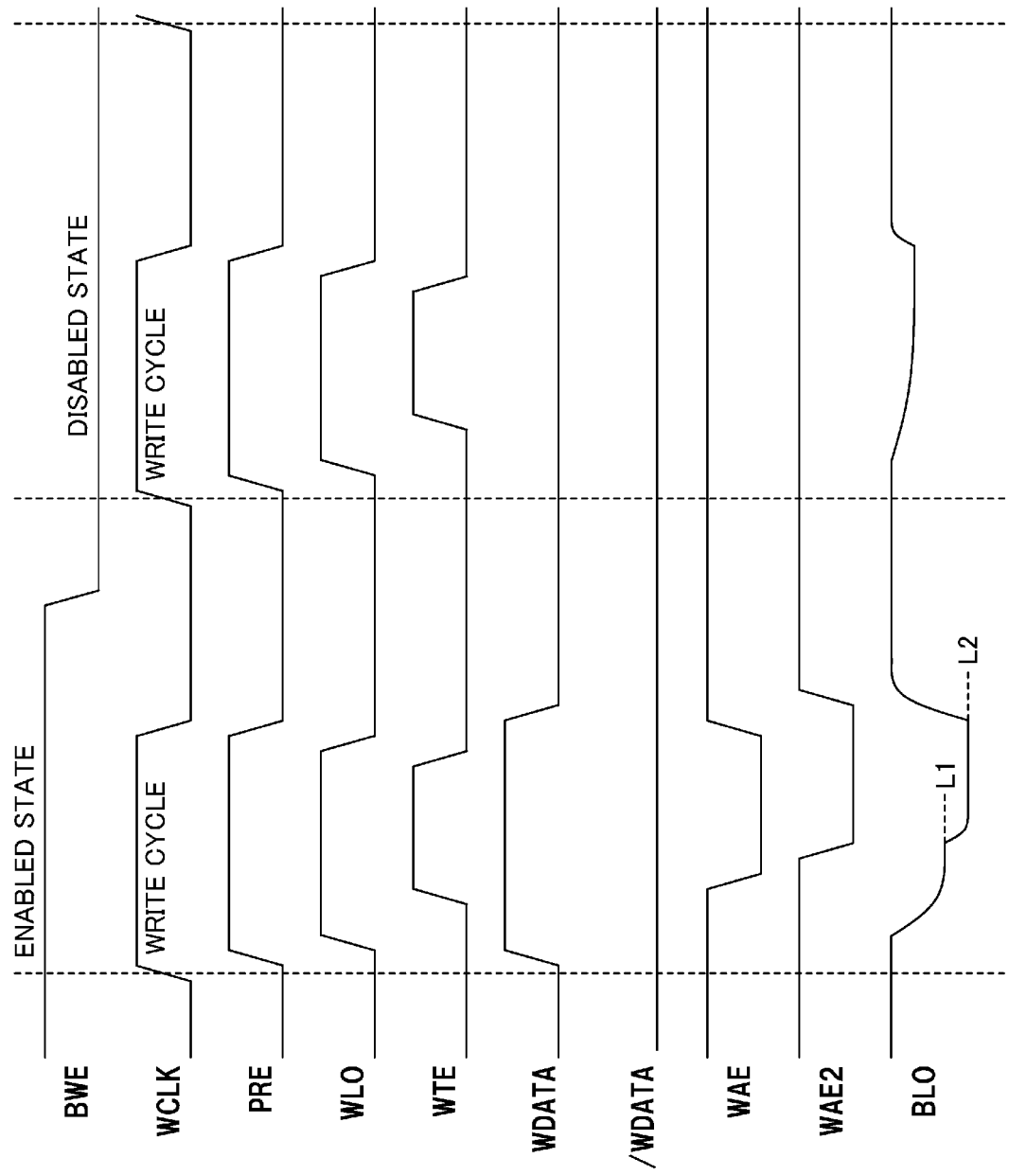
FIG. 4 is a timing chart illustrating a write operation.

A write operation of the semiconductor memory device of FIG. 2 will be described with reference to a timing chart of FIG. 4. Here, a situation where the bit write signal BWE is "H" indicates an enabled state in which data is to be supplied to the bit line pairs, whereas a situation where the bit write signal BWE is "L" indicates a disabled state in which no data is to be supplied to the bit line pairs. A bit write function is achieved through control by the bit write signal BWE. The relationship between the logic level of the bit write signal BWE and whether or not to supply data to the bit line pairs may be reversed.

Before the write operation, all the word lines WL (WL0 to WLmax) are "L," and both the bit line pairs (BL0, /BL0) and (BL1, /BL1) are precharged to be "H" by the precharge signal PRE being "L."

When the bit write signal BWE is "H," which indicates the enabled state, the write operation proceeds as follows.

The D latch circuits 21*a* and 21*b* latch the input data D and the bit write signal BWE, respectively, at a rising edge of the write clock WCLK. During a period when the write clock WCLK is "H," that is, during the write cycle, the output IBWE of the D latch circuit 21*b* is "H." During this period, one of the outputs of the 3-input AND gates 22*a* and 22*b*, that is, one of the write data WDATA and /WDATA is "H" in accordance with the input data D. For example, when the input data D is "H," WDATA is "H" and /WDATA is "L."

At this time, the write control signal WTE is "L." This makes the output WAE of the logic circuit LC1 be "H," regardless of the logic levels of the write data WDATA and /WDATA. Thus, in the negative potential generating circuit 30, the transistor QN1 is turned on, and the potential of the output node WGND is set to the ground potential VSS. Consequently, the ground potential VSS is applied to the sources of the transistors WB0, /WB0, WB1, and /WB1 that are provided at the bit lines BL0, /BL0, BL1, and /BL1, respectively.

Next, the precharge signal PRE becomes "H" to release the precharge of the bit line pairs (BL0, /BL0) and (BL1, /BL1). In addition, one of the word lines WL (here, WL0) becomes "H" to be activated.

Then, one of the transistors WB0, /WB0, WB1, and /WB1 is turned on by the operation of the column selection circuit 40. Specifically, the column address signal CAD selects one of the bit line pairs (BL0, /BL0) and (BL1, /BL1). One of the two transistors on the selected bit line pair is turned on, the one being provided, at its gate, with one of the write data WDATA and /WDATA which is "H." For example, assume that CAD<0> is "H," CAD<1> is "L," WDATA is "H," and /WDATA is "L." The bit line pair (BL0, /BL0) is then selected, and the transistor WB0 of the transistor pair WB0 and /WB0 is turned on. The other transistors /WB0, WB1, and /WB1 are not turned on. As a result, the bit line BL0 shifts from "H" to "L," and changes to the source potential of the transistor WB0, that is, to the ground potential VSS, which is the potential of the output node WGND of the negative potential generating circuit 30 (L1 in FIG. 4).

Next, at the timing when the potential of any one of the bit lines (here, the bit line BL0) changes to "L," the write control signal WTE changes from "L" to "H." This changes the output WAE of the logic circuit LC1 from "H" to "L," and turns off the transistor QN1 in the negative potential generating circuit 30. As a result, the output node WGND becomes "L" with a high impedance. With the change in the output WAE of the logic circuit LC1 from "H" to "L," the output WAE2 of the buffer circuit 31 changes from "H" to "L," following a time delay of the buffer circuit 31.

The output node WGND is connected to one end of the capacitive element C1. The other end of the capacitive element C1 is connected to the output WAE2 of the buffer circuit 31. When the output WAE2 changes from "H" to "L," the capacitive element C1 performs the step-down (charge pump) operation, so that the output node WGND, which is "L" with the high impedance, changes to a further lower "L" corresponding to the capacitance value of the capacitive element C1. Consequently, the potential of the bit line BL0 also changes to "L" (L2 in FIG. 4) with a further lower potential via the transistor WB0. In this manner, the data writing to the memory cells MC is completed.

After the write operation, all the word lines WL (WL0 to WLmax) return to "L," and both the bit line pairs (BL0, /BL0) and (BL1, /BL1) return to the state where the bit line pairs are precharged to be "H" by the precharge signal PRE being "L." The write control signal WTE and the write clock WCLK also return from "H" to "L."

When the bit write signal BWE is "L," which indicates the disabled state, the write operation proceeds as follows.

The D latch circuits 21*a* and 21*b* latch the input data D and the bit write signal BWE, respectively, at a rising edge of the write clock WCLK. During a period when the write clock WCLK is "H," that is, during the write cycle, the output IBWE of the D latch circuit 21*b* is "L." Accordingly, the outputs of the 3-input AND gates 22*a* and 22*b*, that is, the write data WDATA and /WDATA both remain "L," regardless of the input data D.

Next, the precharge signal PRE becomes "H" to release the precharge of the bit line pairs (BL0, /BL0) and (BL1, /BL1). In addition, one of the word lines WL (here, WL0) becomes "H" to be activated. However, since both the write data WDATA and /WDATA are still "L," the transistors WB0, /WB0, WB1 and /WB1 are all maintained in the OFF state. Therefore, no data is written to the memory cells MC.

Even with a change in the write control signal WTE from "L" to "H," the output WAE of the logic circuit LC1 remains "H," and the output WAE2 of the buffer circuit 31 also remains "H." Therefore, the negative potential generating circuit 30 becomes inactive, and the capacitive element C1 does not perform the step-down (charge pump) operation.

After the write operation, all the word lines WL (WL0 to WLmax) return to "L," and both the bit line pairs (BL0, /BL0) and (BL1, /BL1) return to the state where the bit line pairs are precharged to be "H" by the precharge signal PRE being "L." The write control signal WTE and the write clock WCLK also return from "H" to "L."

As described above, according to this embodiment, when the bit write signal BWE indicates the enabled state, the write circuit 10 supplies data to one of the bit line pairs, and activates the negative potential generating circuit 30. The write circuit 10 then supplies a potential to the bit line to be supplied with "L" (e.g., the bit line BL0) via the transistor WB0, the potential having been generated by the negative potential generating circuit 30 and being lower than the ground potential VSS. On the other hand, when the bit write signal BWE indicates the disabled state, the write circuit 10 supplies no data to the bit line pairs, and inactivates the negative potential generating circuit 30. That is, in the write circuit 10, when no data is supplied to the corresponding bit line pair, the negative potential generating circuit 30 is inactivated, thereby avoiding unnecessary power consumption. Therefore, the semiconductor memory device supports the bit write function with lower power consumption.

As an exemplary configuration of the sub-block of the semiconductor memory device according to this embodiment, FIG. 2 illustrates that the memory cells of the two columns are selectively connected to the single write circuit 10. However, in the semiconductor memory device according to this embodiment, the number of columns connected to the write circuit is not limited to two.

Figure 5:
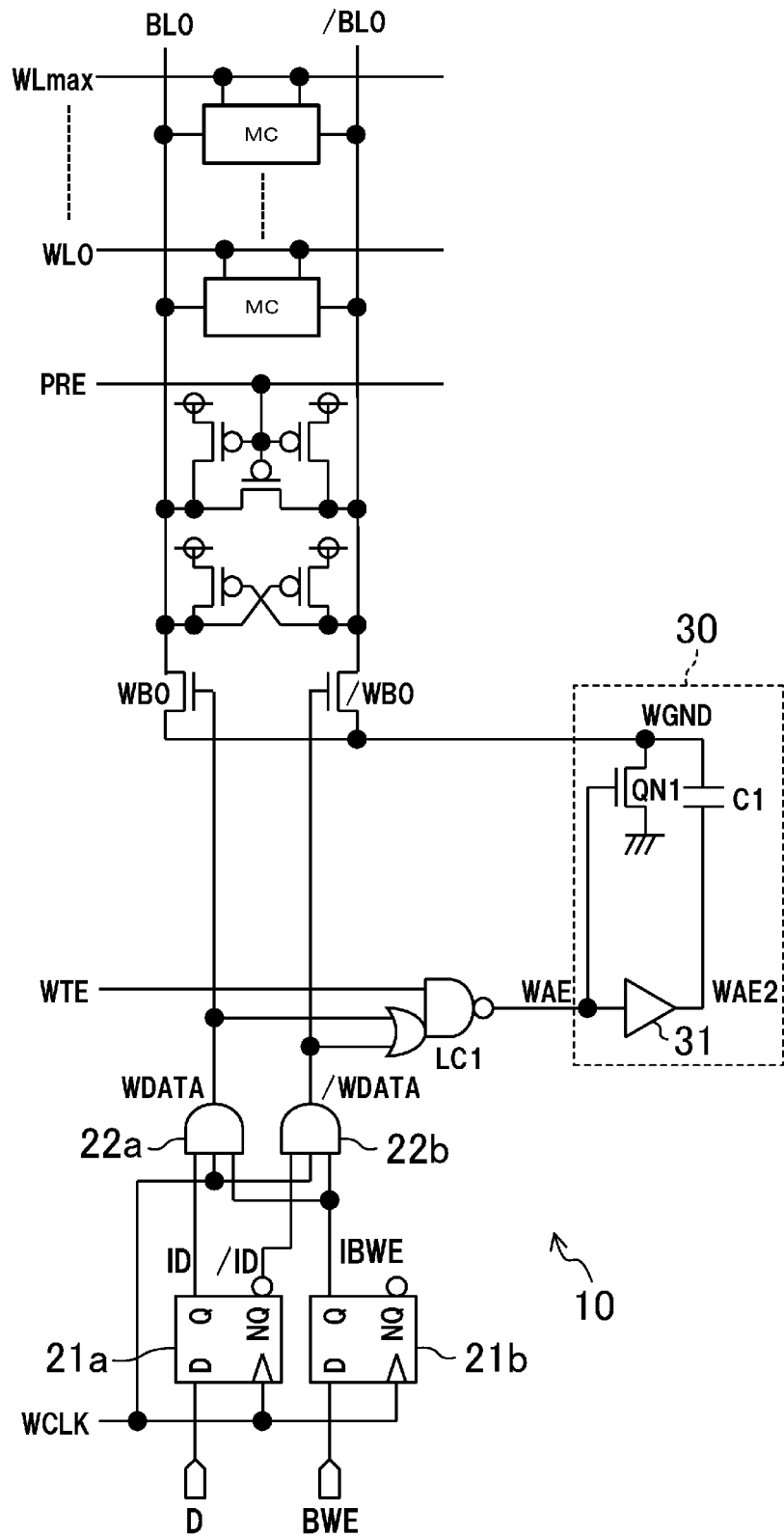
FIG. 5 illustrates another exemplary circuit configuration of the sub-block of the semiconductor memory device according to the first embodiment.

FIG. 5 illustrates a 1-column product, that is, a configuration in which memory cells of one column are connected to a single write circuit 10. In the configuration of FIG. 5, the column selection circuit 40 in the configuration of FIG. 2 is omitted. Instead, WDATA and /WDATA forming a write data line pair are directly connected to the gates of the transistor pair WB0 and /WB0. The write operation of the configuration of FIG. 5 is the same as in the configuration described with reference to FIG. 2.

Second Embodiment

Figure 6:
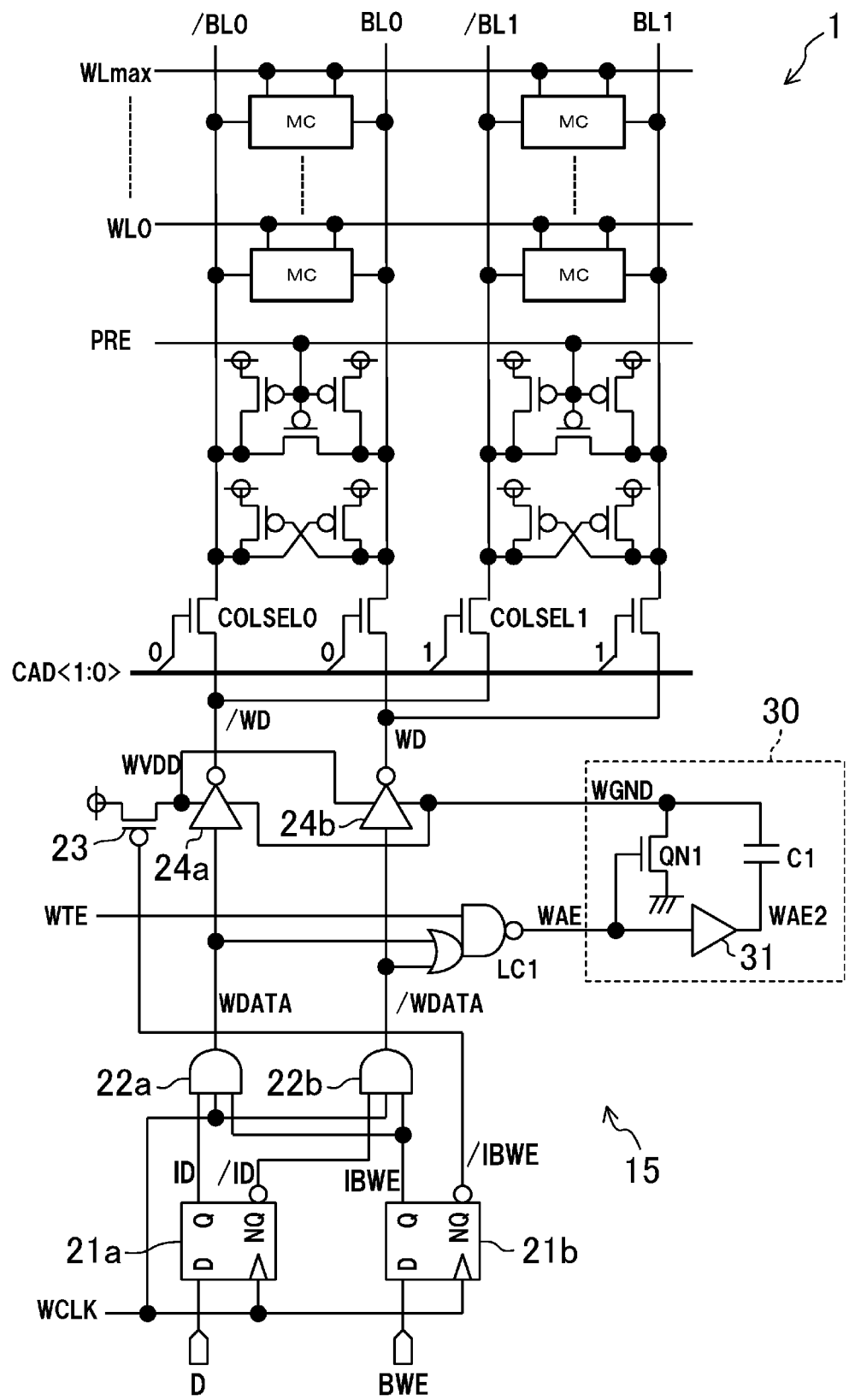
FIG. 6 illustrates an exemplary circuit configuration of a sub-block of a semiconductor memory device according to a second embodiment.

FIG. 6 illustrates an exemplary circuit configuration of a sub-block of a semiconductor memory device according to a second embodiment. In FIG. 6, constituent elements in common with the configuration of FIG. 2 are denoted by the same reference characters, and detailed descriptions thereof may be omitted.

For the sake of simplification, no read system circuit is shown in FIG. 6.

A write circuit 15 includes D latch circuits 21a and 21b, 3-input AND circuits 22a and 22b, a logic circuit LC1, and a negative potential generating circuit 30. The configurations of these components are the same as those in FIG. 2.

In this embodiment, WDATA and /WDATA forming a write data line pair are connected to bit line pairs (BL0, /BL0) and (BL1, /BL1) differently from the first embodiment.

In the configuration of FIG. 2, WDATA and /WDATA of the write data line pair are connected to the gates of the transistors WB0, /WB0, WB1, and /WB1 provided at the bit lines BL0, /BL0, BL1, and /BL1, respectively, via the column selection circuit 40.

By contrast, the configuration of FIG. 6 is provided with inverters 24a and 24b serving as write buffers, and column switches COLSEL0 and COLSEL1. The inverters 24a and 24b serve as exemplary buffers that receive data supplied from the write circuit 15 to the respective bit line pairs and supply the data to the respective bit line pairs. The inputs of the inverters 24a and 24b are connected to WDATA and /WDATA of the write data line pair, respectively. The output /WD of the inverter 24a is connected to the bit line /BL0 via the column switch COLSEL0, and to the bit line /BL1 via the column switch COLSEL1. The output WD of the inverter 24b is connected to the bit line BL0 via the column switch COLSEL0, and to the bit line BL1 via the column switch COLSEL1.

A power supply node WVDD of the inverters 24a and 24b is connected to the power supply via a transistor 23. A ground node of the inverters 24a and 24b is connected to the output node WGND of the negative potential generating circuit 30. The transistor 23 receives, at its gate, an inverted output /IBWE of the D latch circuit 21b.

A write operation of the semiconductor memory device of FIG. 6 will be described. Note that the timing chart of FIG. 4 is also applicable to this embodiment. Also in this embodiment, the bit write signal BWE functions as a write mask signal indicating whether or not to supply data to the bit line pairs. A situation where the bit write signal BWE is "H" indicates an enabled state in which data is to be supplied to the bit line pairs. A situation where the bit write signal BWE is "L" indicates a disabled state where no data is to be supplied to the bit line pairs.

Before the write operation, all the word lines WL (WL0 to WLmax) are "L," and both the bit line pairs (BL0, /BL0) and (BL1, /BL1) are precharged to be "H" by the precharge signal PRE being "L."

When the bit write signal BWE is "H," which indicates the enabled state, the write operation proceeds as follows.

The D latch circuits 21a and 21b latch the input data D and the bit write signal BWE, respectively, at a rising edge of the write clock WCLK. During a period when the write clock WCLK is "H," that is, during the write cycle, the output IBWE of the D latch circuit 21b is "H." During this period, one of the outputs of the 3-input AND gates 22a and 22b, that is, one of the write data WDATA and /WDATA is "H" in accordance with the input data D. For example, when the input data D is "H," WDATA is "H" and /WDATA is "L."

At this time, the write control signal WTE is "L." This makes the output WAE of the logic circuit LC1 be "H," regardless of the logic levels of the write data WDATA and /WDATA. Thus, in the negative potential generating circuit 30, the transistor QN1 is turned on, and the potential of the output node WGND is set to the ground potential VSS. Consequently, the ground potential VSS is applied to the ground node of the inverters 24a and 24b. Since the inverted output /IBWE of the D latch circuit 21b is "L," the transistor 23 is turned on, and the power supply node WVDD of the inverters 24a and 24b become "H." As a result, the output /WD of the inverter 24a becomes "L," and the output WD of the inverter 24b becomes "H."

Next, the precharge signal PRE becomes "H" to release the precharge of the bit line pairs (BL0, /BL0) and (BL1, /BL1). In addition, one of the word lines WL (here, WL0) becomes "H" to be activated.

Then, the column address signal CAD selects and turns on one of the column switches COLSEL0 and COLSEL1. For example, when CAD<0> is "H" and CAD<1> is "L," the column switch COLSEL0 is turned on. Then, outputs /WD and WD of the inverters 24a and 24b are transmitted to the bit lines /BL0 and BL0 of the bit line pair, respectively. As a result, the bit line BL0 shifts from "H" to "L," and changes to the ground potential VSS, which is the potential of the output node WGND of the negative potential generating circuit 30.

Next, at the timing when the potential of any one of the bit lines (here, the bit line BL0) changes to "L," the write control signal WTE changes from "L" to "H." This changes the output WAE of the logic circuit LC1 from "H" to "L," and turns off the transistor QN1 in the negative potential generating circuit 30. As a result, the output node WGND becomes "L" with a high impedance. With the change in the output WAE of the logic circuit LC1 from "H" to "L," the output WAE2 of the buffer circuit 31 changes from "H" to "L," following a time delay of the buffer circuit 31.

The output node WGND is connected to one end of the capacitive element C1. The other end of the capacitive element C1 is connected to the output WAE2 of the buffer circuit 31. When the output WAE2 changes from "H" to "L," the capacitive element C1 performs the step-down (charge pump) operation, so that the output node WGND, which is "L" with the high impedance, changes to a further lower "L" corresponding to the capacitance value of the capacitive element C1. This also changes the potential of the bit line BL0 to "L" with a further lower potential via the inverter 24b. In this manner, the data writing to the memory cells MC is completed.

After the write operation, all the word lines WL (WL0 to WLmax) return to "L," and both the bit line pairs (BL0, /BL0) and (BL1, /BL1) return to the state where the bit line pairs are precharged to be "H" by the precharge signal PRE being "L." The write control signal WTE and the write clock WCLK also return from "H" to "L."

When the bit write signal BWE is "L," which indicates the disabled state, the write operation proceeds as follows.

The D latch circuits 21a and 21b latch the input data D and the bit write signal BWE, respectively, at a rising edge of the write clock WCLK. During a period when the write clock WCLK is "H," that is, during the write cycle, the output IBWE of the D latch circuit 21b is "L." Accordingly, the outputs of the 3-input AND gates 22a and 22b, that is, the write data WDATA and /WDATA both remain "L," regardless of the input data D. Since the inverted output /IBWE of the D latch circuit 21b is "H," the transistor 23 is turned off to disconnect the power supply node WVDD of the inverters 24a and 24b from the power source. Consequently, the outputs /WD and WD of the inverters 24a and 24b come to have a high impedance.

Next, the precharge signal PRE becomes "H" to release the precharge of the bit line pairs (BL0, /BL0) and (BL1, /BL1). In addition, one of the word lines WL (here, WL0) becomes "H" to be activated. The column address signal CAD selects and turns on one of the column switches COLSEL0 and COLSEL1. However, since the outputs /WD and WD of the inverters 24a and 24b have the high impedance, no data is written to the memory cells MC.

Even with a change in the write control signal WTE from "L" to "H," the output WAE of the logic circuit LC1 remains "H," and the output WAE2 of the buffer circuit 31 also remains "H." Therefore, the negative potential generating circuit 30 becomes inactive, and the capacitive element C1 does not perform the step-down (charge pump) operation.

After the write operation, all the word lines WL (WL0 to WLmax) return to "L," and both the bit line pairs (BL0, /BL0) and (BL1, /BL1) return to the state where the bit line pairs are precharged to be "H" by the precharge signal PRE being "L." The write control signal WTE and the write clock WCLK also return from "H" to "L."

As described above, according to this embodiment, when the bit write signal BWE indicates the enabled state, the write circuit 15 supplies data to one of the bit line pairs, and activates the negative potential generating circuit 30. The write circuit 15 then supplies a potential to the bit line to be supplied with "L" (e.g., the bit line BL0) via the inverter 24b, the potential having been generated by the negative potential generating circuit 30 and being lower than the ground potential VSS. On the other hand, when the bit write signal BWE indicates the disabled state, the write circuit 15 supplies no data to the bit line pairs, and inactivates the negative potential generating circuit 30. That is, in the write circuit 15, when no data is supplied to the corresponding bit line pair, the negative potential generating circuit 30 is inactivated, thereby avoiding unnecessary power consumption. Therefore, the semiconductor memory device supports the bit write function with lower power consumption.

As an exemplary configuration of the sub-block of the semiconductor memory device according to this embodiment, FIG. 6 illustrates that the memory cells of the two columns are selectively connected to the single write circuit 15. However, in the semiconductor memory device according to this embodiment, the number of columns connected to the write circuit is not limited to two.

Figure 7:
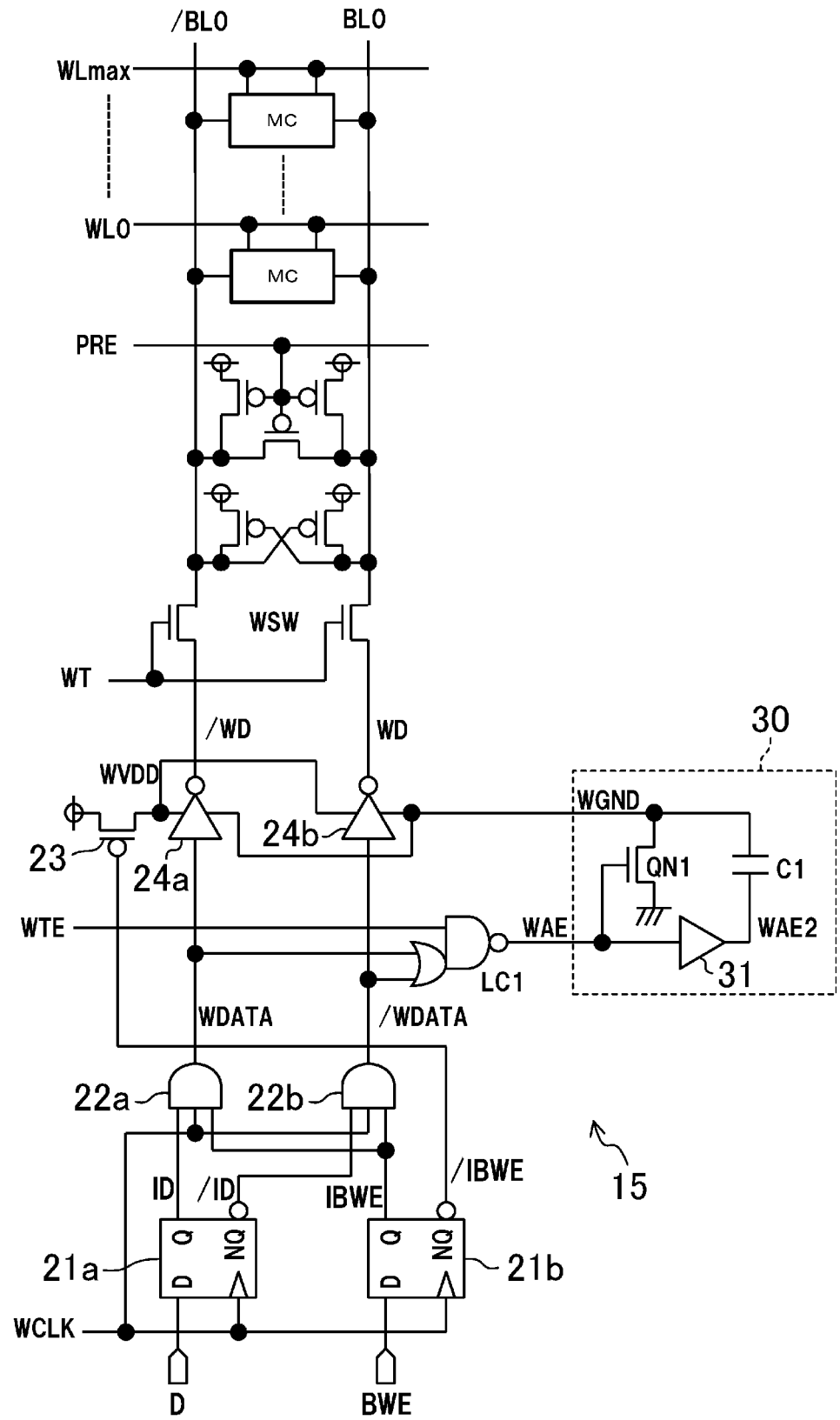
FIG. 7 illustrates another exemplary circuit configuration of the sub-block of the semiconductor memory device according to the second embodiment.

FIG. 7 illustrates a 1-column product, that is, a configuration in which memory cells of one column are connected to a single write circuit 15. The configuration of FIG. 7 includes no column switch COLSEL0 or COLSEL1 of the configuration of FIG. 6. Instead, write switches WSW, which are controlled to be on and off by a write timing signal WT, are provided at bit lines /BL0 and BL0 forming a bit line pair. The write operation of the configuration of FIG. 7 is almost the same as in the configuration described with reference to FIG. 6, except the following difference. In the operation described above, the column address signal CAD turns on one of the column switches COLSEL0 and COLSEL1. Instead, the write timing signal WT turns on the write switch WSW in the configuration of FIG. 7.

Figure 8A:
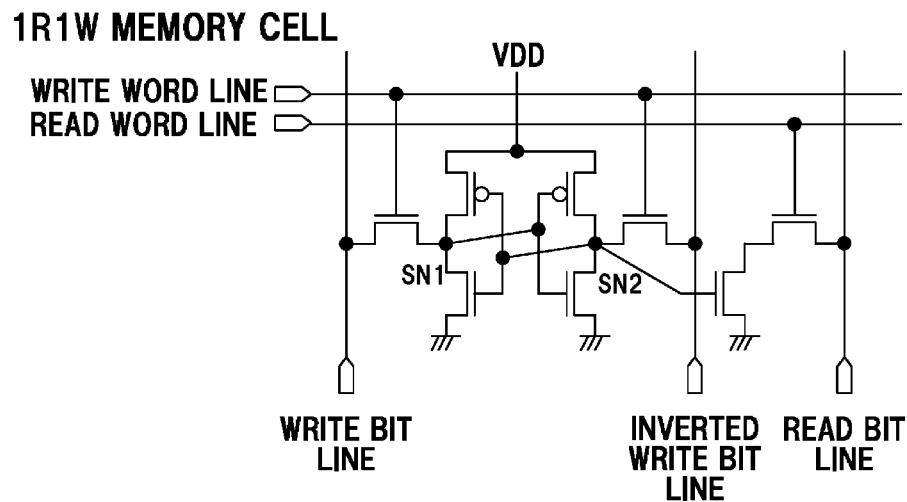
FIGS. 8A and 8B illustrate other circuit configurations of the memory cell.
Figure 8B:
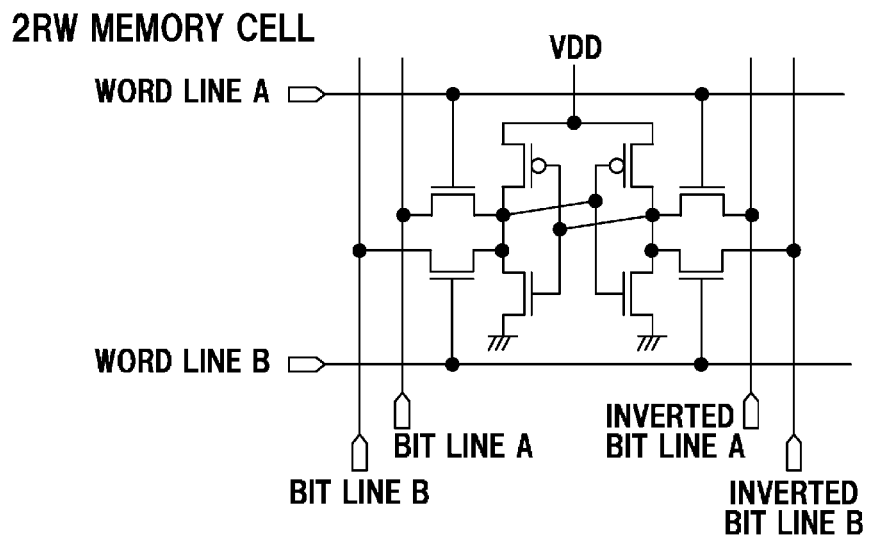

In the embodiment described above, the semiconductor memory device includes the 1RW memory cells shown in FIG. 3. However, the present disclosure is applicable to any other type of memory cell. For example, a semiconductor memory device may include a 1R1W memory cell illustrated in FIG. 8A. The write circuit 10 or 15 described in the above embodiments may be suitably provided for a bit line pair including a write bit line and an inverted write bit line. A semiconductor memory device may include a 2RW memory cell illustrated in FIG. 8B. The write circuits 10 and 15 described in the above embodiments may be suitably provided for a bit line pair including a bit line A and an inverted bit line A, and a bit line pair including a bit line B and an inverted bit line B, respectively.

The present disclosure provides the semiconductor memory device employing the technique of setting the potential of a bit line to a negative potential in a write operation, and capable of supporting the bit write function with lower power consumption. The present disclosure is thus useful in reducing power consumption of, for example, an LSI.

What is claimed is:

1. A semiconductor memory device comprising:
 a plurality of bit line pairs;
 a plurality of word lines;
 a memory cell array including a plurality of memory cells arranged in an array, each of the plurality of memory cells being provided between a first power supply with a first potential and a second power supply with a second potential lower than the first potential, and being connected to one of the bit line pairs and one of the word lines; and
 a write circuit provided for one or more of the bit line pairs, and supplying data to the one or more of the bit line pairs in accordance with a bit value corresponding to the one or more of the bit line pairs of input data having a plurality of bits in a write operation, wherein the write circuit
 includes a negative potential generating circuit that generates a third potential lower than the second potential, and receives a write mask signal with a plurality of bits each corresponding to respective one of the bit line pairs, the write mask signal indicating an enabled state in which data is to be supplied to the one of the bit line pairs or a disabled state in which no data is to be supplied to the one of the bit line pairs, when the write mask signal indicates the enabled state, the write circuit supplies data to the one of the bit line pairs in accordance with a write clock and activates the negative potential generating circuit so as to supply the third potential generated by the negative potential generating circuit to one of bit lines included in the one of the bit line pairs, the one of the bit lines being supplied with low data, and when the write mask signal indicates the disabled state, the write circuit supplies no data to the one of the bit line pairs and inactivates the negative potential generating circuit.

2. The semiconductor memory device according to claim 1, wherein each of the bit line pairs includes a first bit line and a second bit line, and the semiconductor memory device further comprises:

a first transistor having a drain connected to the first bit line, a source connected to an output node of the negative potential generating circuit, and a gate receiving data supplied from the write circuit to the first bit line; and a second transistor having a drain connected to the second bit line, a source connected to the output node of the negative potential generating circuit, and a gate receiving data supplied from the write circuit to the second bit line.

3. The semiconductor memory device according to claim 1, wherein each of the bit line pairs includes a first bit line and a second bit line, and the semiconductor memory device further comprises:

a first buffer having an input receiving data supplied from the write circuit to the first bit line, an output connected to the first bit line, and a ground node connected to an output node of the negative potential generating circuit; and a second buffer having an input receiving data supplied from the write circuit to the second bit line, an output connected to the second bit line, and a ground node connected to the output node of the negative potential generating circuit.

4. The semiconductor memory device according to claim 1, wherein the write mask signal indicates the enabled state at one of a high level and a low level, and the disabled state at the other of the high level and the low level.

5. A method of writing data in a semiconductor memory device including:

a plurality of bit line pairs;

a plurality of word lines;

a memory cell array including a plurality of memory cells arranged in an array, each of the plurality of memory cells being provided between a first power supply with a first potential and a second power supply with a second potential lower than the first potential, and being connected to one of the bit line pairs and one of the word lines; and a negative potential generating circuit that generates a third potential lower than the second potential, the method comprising:

when data is to be supplied to one or more of the bit line pairs, activating the negative potential generating circuit in accordance with a write clock so as to supply the third potential generated by the negative potential generating circuit to one of bit lines included in the one or more of the bit line pairs, the one of the bit lines being supplied with low data; and when no data is to be supplied to the one or more of the bit line pairs, inactivating the negative potential generating circuit.

* * * * *